US012020773B2

(12) United States Patent
Tsai

(10) Patent No.: US 12,020,773 B2
(45) Date of Patent: Jun. 25, 2024

(54) MEMORY SYSTEM AND MEMORY ACCESS INTERFACE DEVICE THEREOF INCLUDING SINGLE DATA RATE (SDR) AND DOUBLE DATA RATE (DDR) MODES

(71) Applicant: REALTEK SEMICONDUCTOR CORPORATION, Hsinchu (TW)

(72) Inventor: Fu-Chin Tsai, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 162 days.

(21) Appl. No.: 17/830,643

(22) Filed: Jun. 2, 2022

(65) Prior Publication Data
US 2023/0008246 A1 Jan. 12, 2023

(30) Foreign Application Priority Data
Jul. 12, 2021 (TW) .................................. 110125554

(51) Int. Cl.
*G11C 7/22* (2006.01)
*G11C 7/10* (2006.01)
*G11C 8/18* (2006.01)

(52) U.S. Cl.
CPC ............ *G11C 7/222* (2013.01); *G11C 7/1069* (2013.01); *G11C 7/1096* (2013.01); *G11C 8/18* (2013.01)

(58) Field of Classification Search
None
See application file for complete search history.

(56) References Cited

U.S. PATENT DOCUMENTS

| 6,060,916 | A  | * | 5/2000  | Park  | G11C 19/00 327/99 |
| 10,998,020 | B1 |   | 5/2021  | Tsai et al. | |
| 10,998,061 | B1 |   | 5/2021  | Tsai et al. | |
| 2001/0039602 | A1 | * | 11/2001 | Kanda | G11C 7/222 711/167 |
| 2005/0005053 | A1 | * | 1/2005  | Jang  | G11C 7/1075 711/1 |
| 2012/0195141 | A1 | * | 8/2012  | Magee | G11C 7/10 365/193 |

* cited by examiner

*Primary Examiner* — J. H. Hur
(74) *Attorney, Agent, or Firm* — WPAT, P.C

(57) ABSTRACT

The present disclosure discloses a memory access interface device. A clock generation circuit generates a reference clock signal. A fake data strobe signal generation circuit receives the reference clock signal and delays a read enable signal from a memory access controller to enable an output of the reference clock signal to generate a fake data strobe signal. A real data strobe signal generation circuit receives a data strobe signal from a memory device and delays the read enable signal to enable an output of the data strobe signal to generate a real data strobe signal. A data reading circuit samples a data signal from the memory device according to a sampling signal to generate a read data signal to the memory access controller. A selection circuit selects the fake and the real data strobe signals as the sampling signal respectively under a single and a double data rate modes.

10 Claims, 5 Drawing Sheets

MEMORY SYSTEM AND MEMORY ACCESS INTERFACE DEVICE THEREOF INCLUDING SINGLE DATA RATE (SDR) AND DOUBLE DATA RATE (DDR) MODES

BACKGROUND OF THE INVENTION

1. Field of the Invention

The present disclosure relates to a memory system and a memory access interface device thereof.

2. Description of Related Art

The configuration of single data rate (SDR) having a low speed is used in the early development of memory technology. However, due to the increasing requirement of the bandwidth of the products, the conventional configuration of single data rate cannot fulfill the requirement of the speed. As a result, the configuration of double data rate (DDR) is proposed to break the speed limit.

The specifications of DDR having higher and higher speed are further proposed under such a configuration. However, the memory controllers on the market are requested to support all the modes having different speeds and the ability of signal calibration. What is required is a design of the memory access interface device that can be used in both the single data rate memory and the double data rate memory.

SUMMARY OF THE INVENTION

In consideration of the problem of the prior art, an object of the present disclosure is to provide a memory system and a memory access interface device thereof.

The present disclosure discloses a memory access interface device that includes a clock generation circuit, a fake data strobe signal generation circuit, a real data strobe signal generation circuit, a data reading circuit and a selection circuit. The clock generation circuit is configured to generate a reference clock signal. The fake data strobe signal generation circuit is configured to receive the reference clock signal and delay a read enable signal from a memory access controller so as to enable an output of the reference clock signal according to an enabling section of the read enable signal to generate a fake data strobe signal. The real data strobe signal generation circuit is configured to receive a data strobe signal from a memory device and delay the read enable signal so as to enable an output of the data strobe signal according to the enabling section of the read enable signal to generate a real data strobe signal. The data reading circuit is configured to sample a data signal from the memory device according to a sampling signal to generate and transmit a read data signal to the memory access controller. The selection circuit is configured to select the fake data strobe signal as the sampling signal under a single data rate mode, and select the real data strobe signal as the sampling signal under a double data rate mode.

The present disclosure also discloses a memory system that includes a memory access controller, a memory device and a memory access interface device. The memory access interface device includes a clock generation circuit, a fake data strobe signal generation circuit, a real data strobe signal generation circuit, a data reading circuit and a selection circuit. The clock generation circuit configured to generate a reference clock signal. The fake data strobe signal generation circuit is configured to receive the reference clock signal and delay a read enable signal from the memory access controller so as to enable an output of the reference clock signal according to an enabling section of the read enable signal to generate a fake data strobe signal. The real data strobe signal generation circuit is configured to receive a data strobe signal from the memory device and delay the read enable signal so as to enable an output of the data strobe signal according to the enabling section of the read enable signal to generate a real data strobe signal. The data reading circuit is configured to sample a data signal from the memory device according to a sampling signal to generate and transmit a read data signal to the memory access controller. The selection circuit is configured to select the fake data strobe signal as the sampling signal under a single data rate mode, and select the real data strobe signal as the sampling signal under a double data rate mode.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory system and a memory access interface device thereof to provide a low cost method to access a memory device with accurate timing whether the memory device is a single data rate memory or a double data rate memory.

Figure 1:
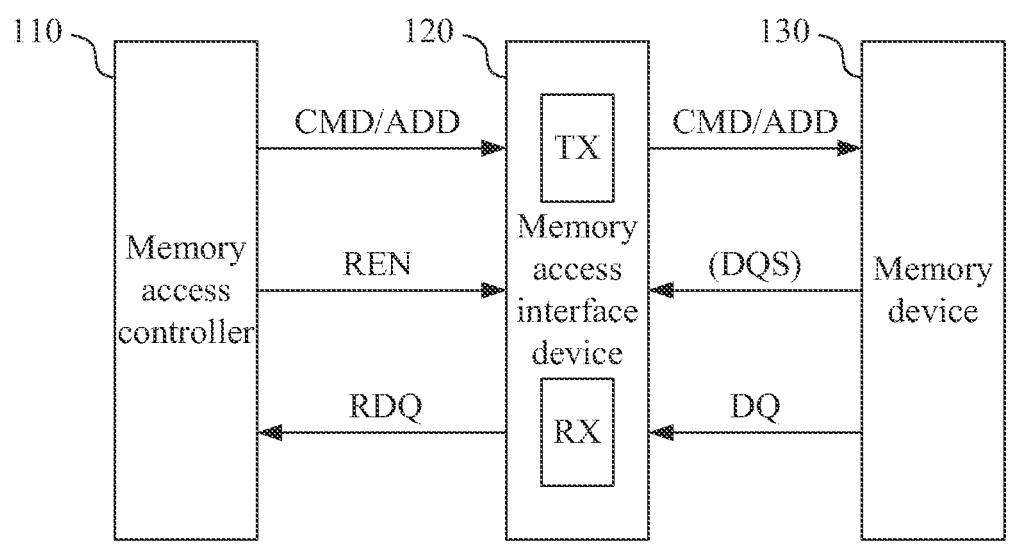
FIG. 1 illustrates a block diagram of a memory system according to an embodiment of the present invention.

Reference is now made to FIG. 1. FIG. 1 illustrates a block diagram of a memory system 100 according to an embodiment of the present invention. The memory system 100 includes a memory access controller 110, a memory access interface device 120 and a memory device 130.

The memory system 100 can be electrically coupled to other modules through such as, but not limited to a system bus (not illustrated). For example, the memory system 100 can be electrically coupled to a processor (not illustrated) through a system bus such that the processor can access the memory system 100.

In an embodiment, the memory access interface device 120 can be such as, but not limited to a physical layer circuit.

The memory device 130 is either a single data rate memory, or a double data rate memory having a speed higher than the single data rate memory.

External access signals, e.g. the access signals from the processor, can be received by the memory access controller 110 first and can be transmitted to the memory access interface device 120. Further, the access signals can be either transmitted from the memory access interface device 120 to the memory device 130 or used as a reference within the memory access interface device 120 to access the memory device 130.

More specifically, in an embodiment, the memory access controller 110 can receive and transmit the access signals including such as, but not limited to a read enable signal REN, a command signal CMD and an address signal ADD.

According to the signals described above, the memory access interface device 120 can activate the memory device 130, receive the data signal DQ from the activated memory device 130 and sample the data signal DQ to generate and transmit a read data signal RDQ to the memory access controller 110.

When the memory device 130 is a single data rate memory, the memory access interface device 120 only receives the data signal DQ from the activated memory device 130 and samples the data signal DQ according to a signal generated inside the memory access interface device 120. When the memory device 13 is a double data rate memory, the memory access interface device 120 receives the data signal DQ and a data strobe signal DQS from the activated memory device 130, and samples the data signal DQ according to the data strobe signal DQS.

As a result, the internal data of the memory device 130 can thus be accessed according to the correct timing of the signals described above.

The memory access interface device 120 includes a receiver RX and a transmitter TX. The transmitter TX receives and transmits the command signal CMD and the address signal ADD to the memory device 130 to active the memory device 130 such that the memory device 130 transmits the data signal DQ to the memory access interface device 120. The receiver RX receives the read enable signal REN and generates a related sampling signal according to different types of memory device 130 (i.e., single data rate memory or double data rate memory) to sample the data signal DQ and finish the access operation performed on the memory device 130.

The configuration and the operation of the receiver RX are described in detail in the following paragraphs.

Figure 2:
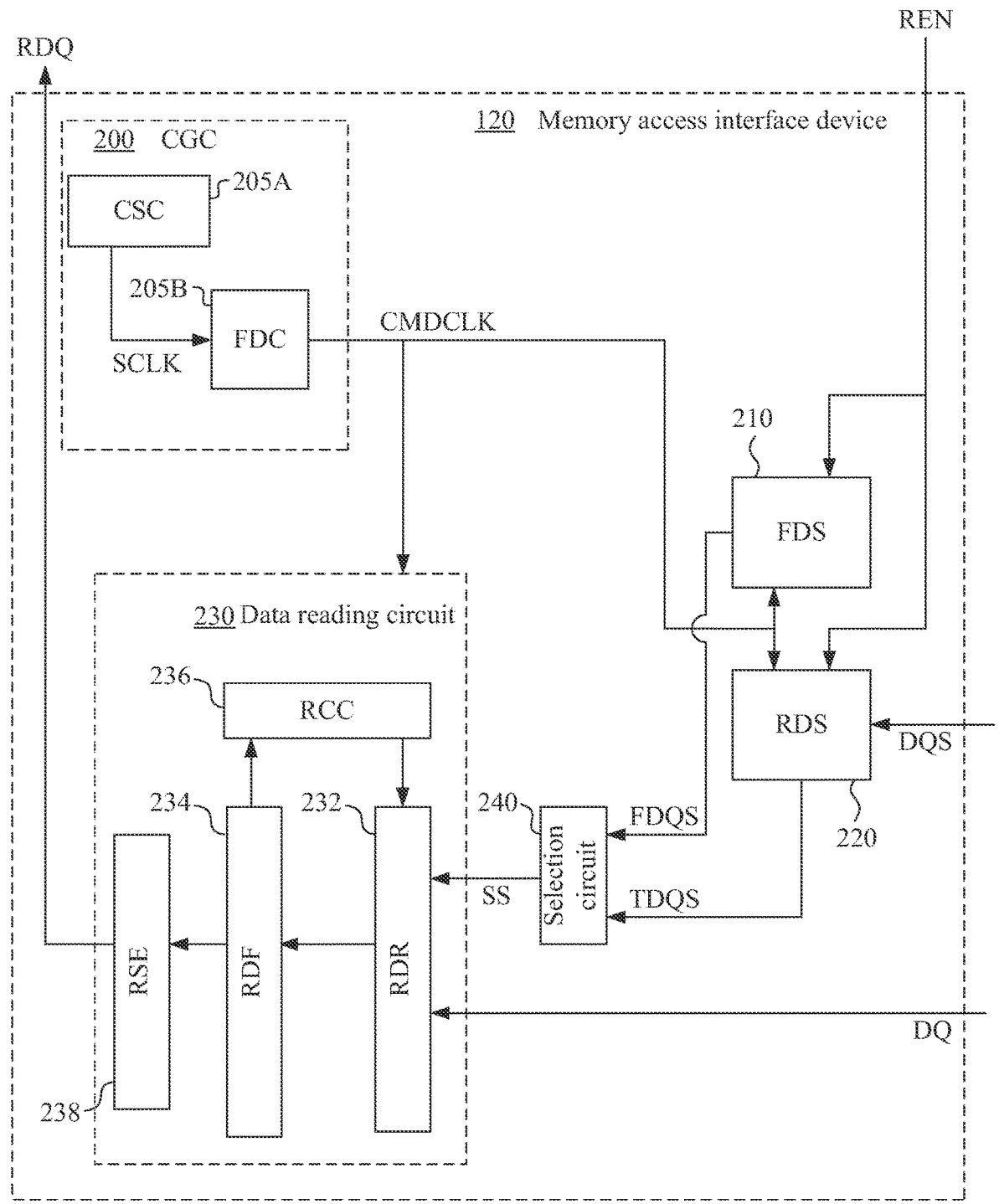
FIG. 2 illustrates a detailed block diagram of the memory access interface device in FIG. 1 according to an embodiment of the present invention.

Reference is now made to FIG. 2 at the same time. FIG. 2 illustrates a detailed block diagram of the memory access interface device 120 in FIG. 1 according to an embodiment of the present invention. It is appreciated that only the receiver RX of the memory access interface device 120 is illustrated in FIG. 2 without illustrating the transmitter TX. More specifically, in an embodiment, the circuit components illustrated in FIG. 2 are all disposed in the receiver RX.

The memory access interface device 120 includes a clock generation circuit 200 (abbreviated as CGC in FIG. 2), a fake data strobe signal generation circuit 210 (abbreviated as FDS in FIG. 2), a real data strobe signal generation circuit 220 (abbreviated as RDS in FIG. 2), a data reading circuit 230 and a selection circuit 240.

The clock generation circuit 200 is configured to generate a reference clock signal CMDCLK. In an embodiment, the clock generation circuit 200 includes a clock source circuit 205A (abbreviated as CSC in FIG. 2) and a frequency division circuit 205B (abbreviated as FDC in FIG. 2). The clock source circuit 205A includes such as, but not limited to a phase lock loop circuit and is configured to generate a source clock signal SCLK. The source clock signal SCLK can be selectively shared with the transmitter TX in FIG. 1. The frequency division circuit 205B is configured to divide the frequency of the source clock signal SCLK to generate the reference clock signal CMDCLK. In an embodiment, all the circuits in the receiver RX can receive the reference clock signal CMDCLK and operate according to the frequency thereof.

The fake data strobe signal generation circuit 210 is configured to receive the reference clock signal CMDCLK and delay the read enable signal REN from the memory access controller 110 so as to enable an output of the reference clock signal CMDCLK according to an enabling section of the read enable signal REN to generate a fake data strobe signal FDQS.

The real data strobe signal generation circuit 220 is configured to receive the data strobe signal DQS from the activated memory device 130 and delay the read enable signal REN so as to enable an output of the data strobe signal DQS according to the enabling section of the read enable signal REN to generate a real data strobe signal TDQS.

The data reading circuit 230 is configured to sample the data signal DQ from the activated memory device 130 according to a sampling signal SS to generate and transmit the read data signal RDQ to the memory access controller 110.

The selection circuit 240 is configured to select the fake data strobe signal FDQS as the sampling signal SS under a single data rate mode, and select the real data strobe signal TDQS as the sampling signal SS under a double data rate mode.

In an embodiment, selection circuit 240 operates under the single data rate mode when the memory device 130 is the single data rate memory and operates under the double data rate mode when the memory device 130 is the double data rate memory.

Figure 3:
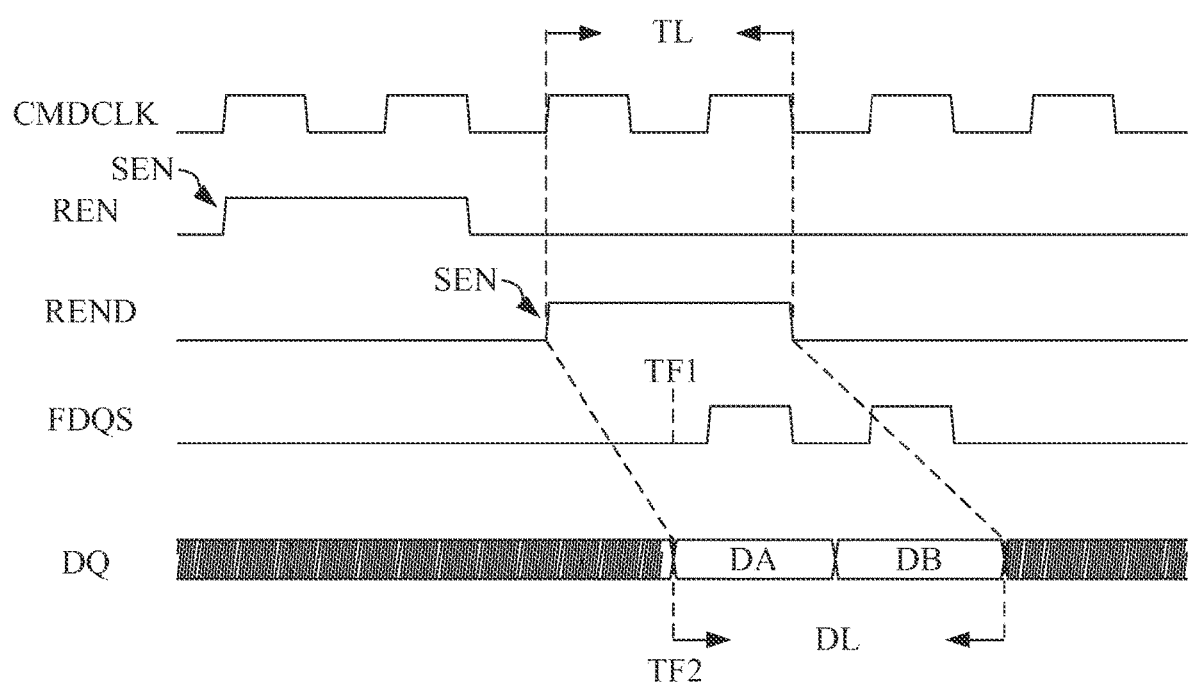
FIG. 3 illustrates a waveform diagram of a plurality of signals related to the operation of the fake data strobe signal generation circuit according to an embodiment of the present invention.

Reference is now made to FIG. 3. FIG. 3 illustrates a waveform diagram of a plurality of signals related to the operation of the fake data strobe signal generation circuit 210 according to an embodiment of the present invention.

When the memory device 130 is the single data rate memory, the activated memory device 130 only transmits the data signal DQ to the data reading circuit 230 without transmitting the data strobe signal DQS. Under such a condition, the fake data strobe signal generation circuit 210 is configured to generate the fake data strobe signal FDQS such that the selection circuit 240 operates under the single data rate mode selects the fake data strobe signal FDQS as the sampling signal SS.

As illustrated in FIG. 3, the fake data strobe signal generation circuit 210 delays the read enable signal REN to generate a delayed read enable signal REND. The enabling section SEN of the read enable signal REN is delayed as well and is used to enable the output of the reference clock signal CMDCLK. More specifically, the fake data strobe signal generation circuit 210 only allows the part of the reference clock signal CMDCLK corresponding to the enabling section SEN to be outputted as the fake data strobe signal FDQS.

In an embodiment, an initial time point TF1 of the fake data strobe signal FDQS matches an arriving time point TF2 that the memory device 130 transmits the data signal DQ to the data reading circuit 230.

More specifically, when the memory access interface device 120 performs read operation on the memory device 130, the time required for such an operation includes the time that the command signal CMD and the address signal ADD in FIG. 1 are transmitted from the transmitter TX of the memory access interface device 120 to the memory device 130, the time that the memory device 130 performs processing and retrieves the corresponding data from the corresponding address, and the time that the memory device 130 transmits the data signal DQ through a transmission line to the data reading circuit 230.

As a result, the timing corresponding to the total time that the fake data strobe signal generation circuit 210 delays the read enable signal REN and generates the fake data strobe signal FDQS needs to match the timing corresponding to the total time of the operations described above.

It is appreciated that the term "match" means that the two timings can have a tolerable difference therebetween and do not necessarily equal to each other under the condition that the accuracy of the access operation is not affected.

In an embodiment, a time length TL of the enabling section SEN of the read enable signal REN corresponding to the fake data strobe signal generation circuit 210 matches the data length DL of the data signal DQ. More specifically, the time length TL of the enabling section SEN has to make the fake data strobe signal FDQS capable of sampling all the data content included in the data signal DQ. Take FIG. 3 as an example, the data signal DQ includes two pieces of data DA and DB. The time length TL of the enabling section SEN has to make the fake data strobe signal FDQS include two sampling periods. After the selection circuit 240 selects the fake data strobe signal FDQS as the sampling signal SS, the data reading circuit 230 samples the data DA and DB according to the sampling signal SS.

Similarly, the term "match" means that the time length TL and the data length DL can have a tolerable difference therebetween and do not necessarily equal to each other under the condition that the accuracy of the access operation is not affected.

Figure 4:
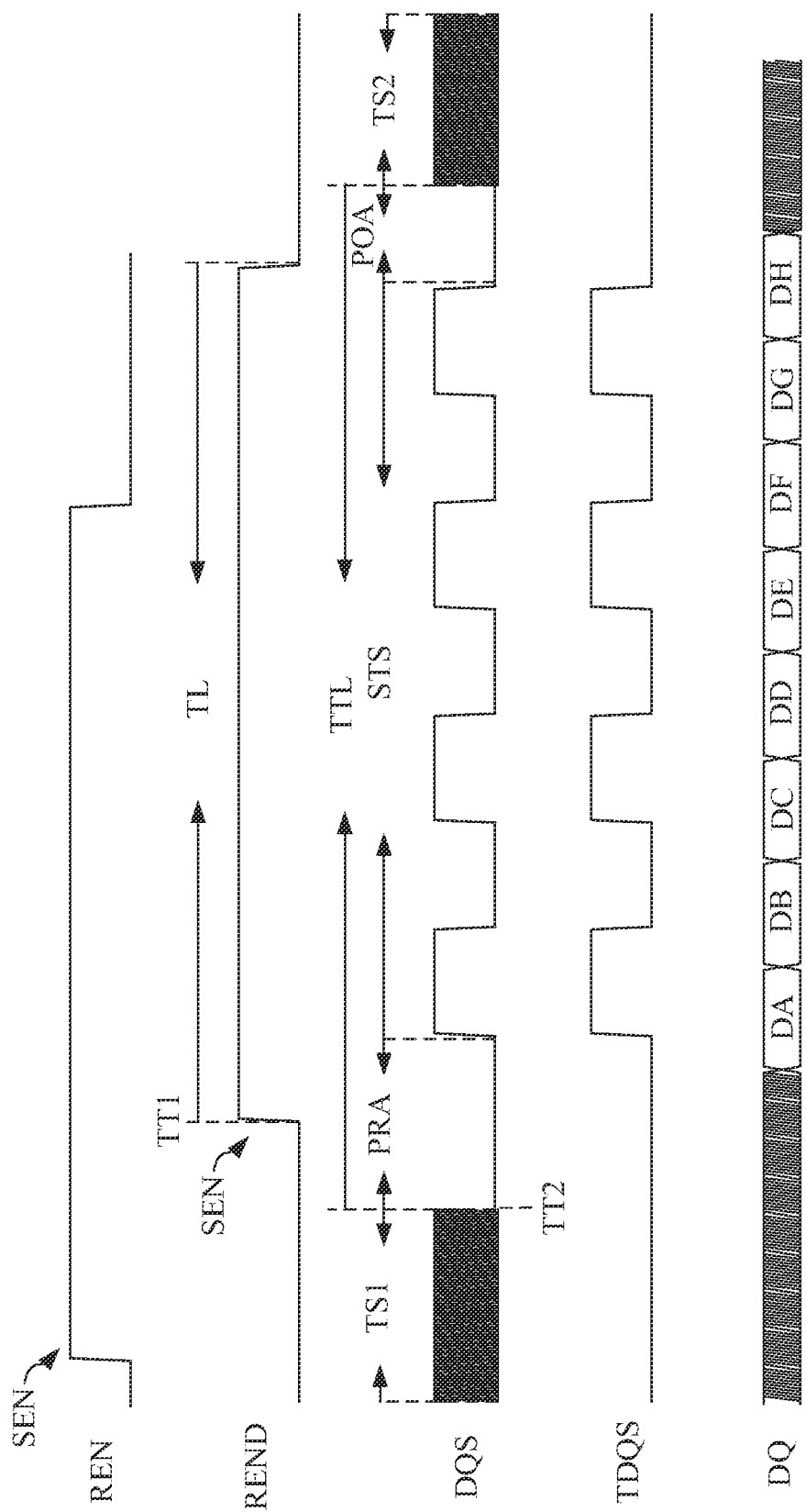
FIG. 4 illustrates a waveform diagram of a plurality of signals related to the operation of the real data strobe signal generation circuit according to an embodiment of the present invention.

Reference is now made to FIG. 4. FIG. 4 illustrates a waveform diagram of a plurality of signals related to the operation of the real data strobe signal generation circuit 220 according to an embodiment of the present invention.

When the memory device 130 is the double data rate memory, the activated memory device 130 transmits both the data signal DQ and the data strobe signal DQS to the data reading circuit 230. Under such a condition, the real data strobe signal generation circuit 220 is configured to generate the real data strobe signal TDQS such that the selection circuit 240 operates under the double data rate mode selects the real data strobe signal TDQS as the sampling signal SS.

As illustrated in FIG. 4, the real data strobe signal generation circuit 220 delays the read enable signal REN to generate a delayed read enable signal REND. The enabling section SEN of the read enable signal REN is delayed as well and is used to enable the output of the data strobe signal DQS. More specifically, the real data strobe signal generation circuit 220 only allows the part of the data strobe signal DQS corresponding to the enabling section SEN to be outputted as the real data strobe signal TDQS.

In an embodiment, an initial time point TT1 of the real data strobe signal TDQS matches an arriving time point TT2 that the memory device 130 transmits the data strobe signal DQS to the real data strobe signal generation circuit 220.

More specifically, when the memory access interface device 120 performs read operation on the memory device 130, the time required for such an operation includes the time that the command signal CMD and the address signal ADD in FIG. 1 are transmitted from the transmitter TX of the memory access interface device 120 to the memory device 130, the time that the memory device 130 performs processing and generates the data strobe signal DQS, and the time that the memory device 130 transmits the data strobe signal DQS through a transmission line to the real data strobe signal generation circuit 220.

As a result, the timing corresponding to the total time that the real data strobe signal generation circuit 220 delays the read enable signal REN needs to match the timing corresponding to the total time of the operations described above.

It is appreciated that the term "match" means that the two timings can have a tolerable difference therebetween and do not necessarily equal to each other under the condition that the accuracy of the access operation is not affected.

As illustrated in FIG. 4, the data strobe signal DQS includes a tri-state section TS1 prior to a preamble section PRA and a tri-state section TS2 behind a postamble section POA. Since the time length of each of the preamble section PRA and the postamble section POA is pretty short (such as but not limited to a length of one cycle or two cycles), the read enable signal REN provides a gating mechanism to precisely eliminate the tri-state section TS1 and the tri-state section TS2 and output a clean real data strobe signal TDQS. Such a design prevents the unstable shifting of the signal due to the variation of the manufacturing process, voltage and temperature.

In an embodiment, the time length TL of the enabling section SEN of the read enable signal REN corresponding to the real data strobe signal generation circuit 220 matches a total time length TTL of the preamble section PRA, the strobe section STS and the postamble section POA of the data strobe signal DQS.

In an embodiment, since the data strobe signal DQS is configured to sample the data signal DQ, the timing of the data strobe signal DQS matches the timing of the data signal DQ. The time length of the strobe section STS of the data strobe signal DQS matches the data length DL of the data signal DQ as well. As a result, the real data strobe signal TDQS generated according to the method described above also includes the strobe section STS having the same timing and the same time length. Take FIG. 4 as an example, the data signal DQ includes 8 pieces of data DA~DH, and the strobe section STS has 4 sampling period. After the selection circuit 240 selects the real data strobe signal TDQS as the sampling signal SS, the data reading circuit 230 samples the data DA~DH according to the sampling signal SS.

Similarly, the term "match" means that the time length TL and the data length DL can have a tolerable difference therebetween and do not necessarily equal to each other under the condition that the accuracy of the access operation is not affected.

In an embodiment, the data reading circuit 230 includes a read data receiving circuit 232 (abbreviated as RDR in FIG. 2) that operates according to such as, but not limited to the reference clock signal CMDCLK, a read data first-in-first-out circuit 234 (abbreviated as RDF in FIG. 2), a read calibration circuit 236 (abbreviated as RCC in FIG. 2) and read data selection circuit 238 (abbreviated as RSE in FIG. 2).

The read data receiving circuit 232 is configured to sample the data signal DQ according to the sampling signal SS. The read data first-in-first-out circuit 234 is configured to perform clock domain conversion on the data sampled by the read data receiving circuit 232 to generate the read data signal RDQ.

In an embodiment, the clock domain conversion is used to convert the clock domain of the data between the read data receiving circuit 232 and the memory access controller 110.

The read calibration circuit 236 is configured to perform operation on the data stored in the read data first-in-first-out circuit 234 according to a predetermined algorithm to generate a feedback calibration signal (not labeled in the figure) to the read data receiving circuit 232.

Under the single data rate mode, the data reading circuit 230 is configured to samples the data signal DQ according to one of two edges of each of a sampling period of the sampling signal SS to generate two sampling result. The read data selection circuit 238 selects one of the two sampling results according to a timing relation between the sampling signal SS and the data signal DQ to generate the read data signal RDQ.

Figure 5:
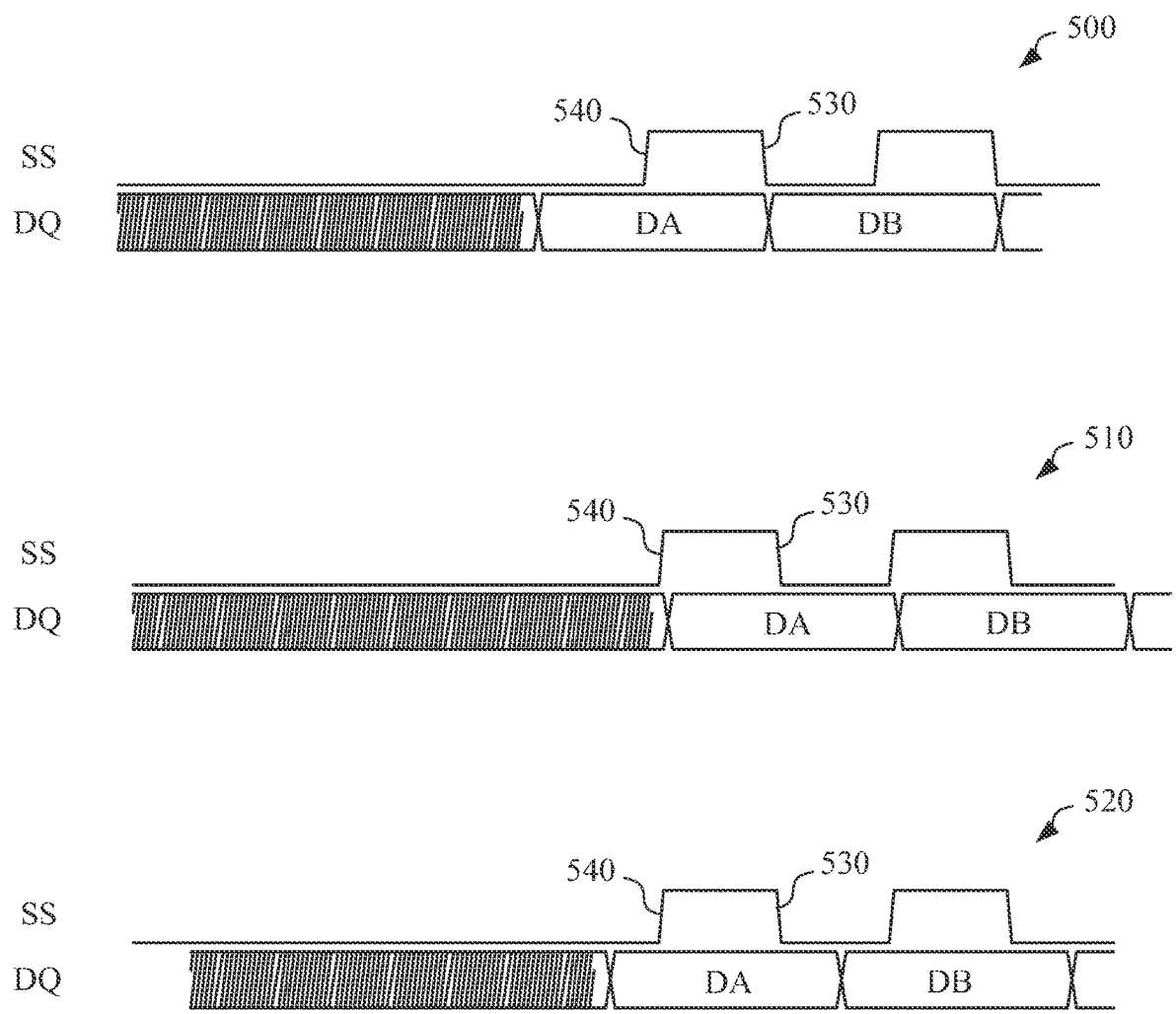
FIG. 5 illustrates a diagram of the timing relation between the sampling signal and the data signal according to an embodiment of the present invention.

Reference is now made to FIG. 5. FIG. 5 illustrates a diagram of the timing relation between the sampling signal SS and the data signal DQ according to an embodiment of the present invention.

As illustrated in FIG. 5, the timing relation between the sampling signal SS and the data signal DQ may correspond to one of a condition 500, a condition 510 and a condition 520.

In the condition 500, the falling edge 530 of the sampling signal SS is at a transition state between the two data DA and DB such that an incorrect sampling result occurs easily. As a result, the read data selection circuit 238 selects and outputs the sampling result corresponding to the rising edge 540 of the sampling signal SS in the condition 500 to generate the read data signal RDQ.

In the condition 510, the rising edge 540 of the sampling signal SS is at the transition state between the two data DA and DB such that an incorrect sampling result occurs easily. As a result, the read data selection circuit 238 selects and outputs the sampling result corresponding to the falling edge 530 of the sampling signal SS in the condition 500 to generate the read data signal RDQ.

In the condition 520, both the falling edge 530 and the rising edge 540 of the sampling signal SS are able to sample the data. As a result, the read data selection circuit 238 can select and output the sampling result of one of the falling edge 530 and the rising edge 540 to generate the read data signal RDQ.

It is appreciated that the timing relation between the sampling signal SS and the data signal DQ can be obtained by a test procedure performed in advanced, in which the data signal DQ used in the test procedure is sampled by the sampling signal SS so as to observe the sampling result. The read data selection circuit 238 can be configured accordingly such that the read data selection circuit 238 selects and outputs the sampling result of one of the falling edge 530 and the rising edge 540 of the sampling signal SS based on the method described above in actual operation.

On the other hand, under the double data rate mode, the data reading circuit 230 is configured to sample the data signal DQ according to the two edges of each of the sampling period of the sampling signal SS to generate two sampling results. The read data selection circuit 238 is bypassed such that the two sampling results are outputted to generate the read data signal RDQ.

It is appreciated that the embodiments described above are merely an example. In other embodiments, it should be appreciated that many modifications and changes may be made by those of ordinary skill in the art without departing, from the spirit of the invention.

In summary, the memory system and the memory access interface device thereof of the present invention can provide a low cost method to access a memory device with accurate timing whether the memory device is a single data rate memory or a double data rate memory.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory access interface device comprising:
    a clock generation circuit configured to generate a reference clock signal;
    a fake data strobe signal generation circuit configured to receive the reference clock signal and delay a read enable signal from a memory access controller so as to enable an output of the reference clock signal according to an enabling section of the read enable signal to generate a fake data strobe signal;
    a real data strobe signal generation circuit configured to receive a data strobe signal from a memory device and delay the read enable signal so as to enable an output of the data strobe signal according to the enabling section of the read enable signal to generate a real data strobe signal;
    a data reading circuit configured to sample a data signal from the memory device according to a sampling signal to generate and transmit a read data signal to the memory access controller; and
    a selection circuit configured to select the fake data strobe signal as the sampling signal under a single data rate mode, and select the real data strobe signal as the sampling signal under a double data rate mode.

2. The memory access interface device of claim 1, further comprising a receiver, and wherein the clock generation circuit, the fake data strobe signal generation circuit, the real data strobe signal generation circuit, the data reading circuit and the selection circuit are disposed in the receiver.

3. The memory access interface device of claim 1, wherein an initial time point of the fake data strobe signal matches an arriving time point that the memory device transmits the data signal to the data reading circuit;
    the initial time point of the real data strobe signal matches the arriving time point that the memory device transmits the data strobe signal to the real data strobe signal generation circuit;
    a time length of the enabling section of the read enable signal corresponding to the fake data strobe signal generation circuit matches a data length of the data signal;
    the time length of the enabling section of the read enable signal corresponding to the real data strobe signal generation circuit matches a total time length of a preamble section, a strobe section and a postamble section of the data strobe signal.

4. The memory access interface device of claim 1, wherein under the single data rate mode, the data reading circuit is configured to sample the data signal according to two edges of each of a sampling period of the sampling signal to generate two sampling results so as to select and output one of the two sampling results to generate the read data signal according to a timing relation between the sampling signal and the data signal;
    under the double data rate mode, the data reading circuit is configured to sample the data signal according to the two edges of each of the sampling period of the sampling signal to generate and output the two sampling results to generate the read data signal.

5. The memory access interface device of claim 1, wherein the memory device is a single data rate (SDR) memory or a double data rate (DDR) memory.

6. A memory system, comprising:
a memory access controller;
a memory device; and
a memory access interface device, comprising:
- a clock generation circuit configured to generate a reference clock signal;
- a fake data strobe signal generation circuit configured to receive the reference clock signal and delay a read enable signal from the memory access controller so as to enable an output of the reference clock signal according to an enabling section of the read enable signal to generate a fake data strobe signal;
- a real data strobe signal generation circuit configured to receive a data strobe signal from the memory device and delay the read enable signal so as to enable an output of the data strobe signal according to the enabling section of the read enable signal to generate a real data strobe signal;
- a data reading circuit configured to sample a data signal from the memory device according to a sampling signal to generate and transmit a read data signal to the memory access controller; and
- a selection circuit configured to select the fake data strobe signal as the sampling signal under a single data rate mode, and select the real data strobe signal as the sampling signal under a double data rate mode.

7. The memory system of claim 6, wherein the memory access interface device further comprises a receiver, and the clock generation circuit, the fake data strobe signal generation circuit, the real data strobe signal generation circuit, the data reading circuit and the selection circuit are disposed in the receiver.

8. The memory system of claim 6, wherein an initial time point of the fake data strobe signal matches an arriving time point that the memory device transmits the data signal to the data reading circuit;
- the initial time point of the real data strobe signal matches the arriving time point that the memory device transmits the data strobe signal to the real data strobe signal generation circuit;
- a time length of the enabling section of the read enable signal corresponding to the fake data strobe signal generation circuit matches a data length of the data signal;
- the time length of the enabling section of the read enable signal corresponding to the real data strobe signal generation circuit matches a total time length of a preamble section, a strobe section and a postamble section of the data strobe signal.

9. The memory system of claim 6, wherein under the single data rate mode, the data reading circuit is configured to sample the data signal according to two edges of each of a sampling period of the sampling signal to generate two sampling results so as to select and output one of the two sampling results to generate the read data signal according to a timing relation between the sampling signal and the data signal;
- under the double data rate mode, the data reading circuit is configured to sample the data signal according to the two edges of each of the sampling period of the sampling signal to generate and output the two sampling results to generate the read data signal.

10. The memory system of claim 6, wherein the memory device is a single data rate memory or a double data rate memory.

* * * * *